United States Patent
Ichikawa et al.

(10) Patent No.: US 12,074,254 B2
(45) Date of Patent: Aug. 27, 2024

(54) NITRIDE SEMICONDUCTOR DEVICE AND SUBSTRATE THEREOF, METHOD FOR FORMING RARE EARTH ELEMENT-ADDED NITRIDE LAYER, AND RED-LIGHT EMITTING DEVICE AND METHOD FOR MANUFACTURING THE SAME

(71) Applicant: OSAKA UNIVERSITY, Suita (JP)

(72) Inventors: Shuhei Ichikawa, Suita (JP); Yasufumi Fujiwara, Suita (JP); Jun Tatebayashi, Suita (JP)

(73) Assignee: OSAKA UNIVERSITY, Suita (JP)

( * ) Notice: Subject to any disclaimer, the term of this patent is extended or adjusted under 35 U.S.C. 154(b) by 735 days.

(21) Appl. No.: 17/271,173

(22) PCT Filed: Aug. 30, 2019

(86) PCT No.: PCT/JP2019/034070
§ 371 (c)(1),
(2) Date: Feb. 24, 2021

(87) PCT Pub. No.: WO2020/050159
PCT Pub. Date: Mar. 12, 2020

(65) Prior Publication Data
US 2021/0399175 A1 Dec. 23, 2021

(30) Foreign Application Priority Data

Sep. 3, 2018 (JP) .................................. 2018-164868
Feb. 22, 2019 (JP) .................................. 2019-029938

(51) Int. Cl.
*H01L 33/32* (2010.01)
*H01L 33/00* (2010.01)
(Continued)

(52) U.S. Cl.
CPC .......... *H01L 33/325* (2013.01); *H01L 33/007* (2013.01); *H01L 33/0075* (2013.01); *H01L 33/025* (2013.01); *H01L 33/16* (2013.01)

(58) Field of Classification Search
CPC . H01L 33/325; H01L 33/007; H01L 33/0075; H01L 33/025; H01L 33/16
(Continued)

(56) References Cited

U.S. PATENT DOCUMENTS

2004/0245535 A1* 12/2004 D'Evelyn ............... H01L 33/32
257/94
2005/0098095 A1* 5/2005 D'Evelyn ............... C30B 7/005
117/105
(Continued)

FOREIGN PATENT DOCUMENTS

JP 2004-335635 A 11/2004
JP 2008-308349 A 12/2008
(Continued)

OTHER PUBLICATIONS

Yasufumi et al. JP2014175482 Red Light-Emitting Semiconductor Element and Manufacturing Method Therefor Sep. 2, 2014, with English translation by USPTO-PE2E (Year: 2014).*
(Continued)

*Primary Examiner* — Tu-Tu V Ho
(74) *Attorney, Agent, or Firm* — Birch, Stewart, Kolasch & Birch, LLP

(57) ABSTRACT

The purpose of the present invention is to provide a technique of manufacturing a nitride semiconductor layer with which, when producing a semiconductor device by forming a nitride semiconductor layer on off-angle inclined substrate, it is possible to stably supply high-quality semiconductor devices by preventing occurrence of a macro step using a material that is not likely to occur lattice strains or crystal
(Continued)

defects by mixing with GaN and does not require continuous addition; and provided is a nitride semiconductor device which comprises a nitride semiconductor layer formed on a substrate, wherein the substrate is inclined at an off angle, a rare earth element-added nitride layer to which a rare earth element is added is formed on the substrate as a primed layer, and a nitride semiconductor layer is formed on the rare earth element-added nitride layer.

22 Claims, 11 Drawing Sheets

(51) Int. Cl.
  *H01L 33/02* (2010.01)
  *H01L 33/16* (2010.01)
(58) Field of Classification Search
  USPC .......................................................... 257/77
  See application file for complete search history.

(56) References Cited

U.S. PATENT DOCUMENTS

| 2009/0200545 A1* | 8/2009 | Nakahara ............. H01L 29/045 |
| | | 257/E29.094 |
| 2010/0320443 A1 | 12/2010 | Jiang et al. |
| 2012/0077299 A1 | 3/2012 | Nishikawa et al. |
| 2019/0280156 A1 | 9/2019 | Fujiwara et al. |

FOREIGN PATENT DOCUMENTS

| JP | 2013-120848 A | 6/2013 |
| JP | 2014-175482 A | 9/2014 |
| JP | 2016-88803 A | 5/2016 |
| WO | WO 2008/024991 A1 | 2/2008 |
| WO | WO 2018/097102 A1 | 5/2018 |

OTHER PUBLICATIONS

International Preliminary Report on Patentability for International Application No. PCT/JP2019/034070, dated May 22, 2020, with an English translation.
Taiwanese Office Action and Search Report for Taiwanese Application No. 108131064, dated Jul. 14, 2020, with an English translation.
International Search Report for PCT/JP2019/034070 (PCT/ISA/210) mailed on Nov. 19, 2019.
Shu et al., "Isoelectronic In-doping effect in GaN films grown by metalorganic chemical vapor deposition", Applied Physics Letters, vol. 73, No. 5, Aug. 3, 1998, American Institute of Physics, pp. 641-643.
Written Opinion of the International Searching Authority for PCT/JP2019/034070 (PCT/ISA/237) mailed on Nov. 19, 2019.
Extended European Search Report for European Application No. 19858257.9, dated Aug. 31, 2021.
Steckl et al., "Rare-Earth-Doped GaN: Growth, Properties, and Fabrication of Electroluminescent Devices," IEEE Journal of Selected Topics in Quantum Electronics, vol. 8, No. 4, Jul. 2002, pp. 749-766.
Chinese Office Action and Search Report dated Aug. 23, 2023 for Application No. 201980055915.3.

* cited by examiner

[FIG. 1]
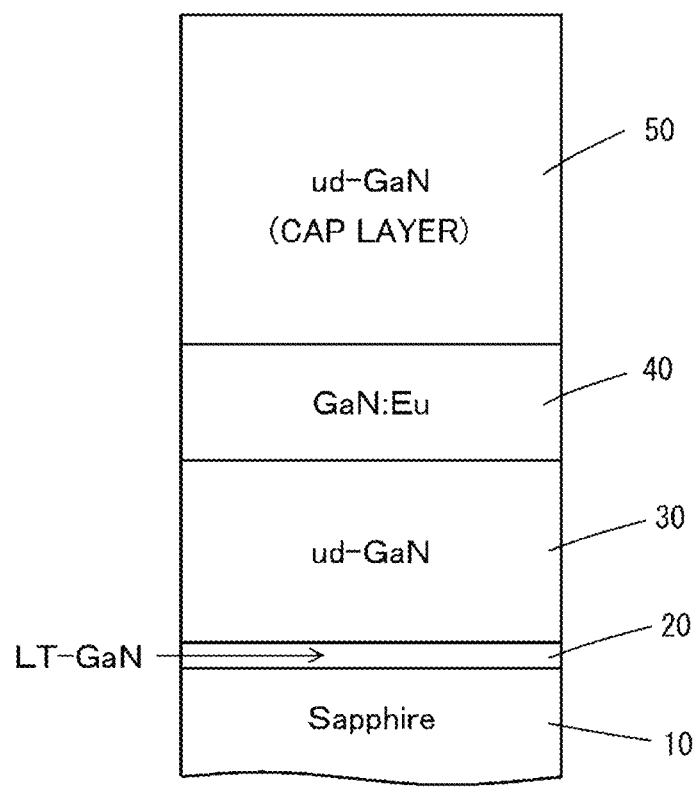

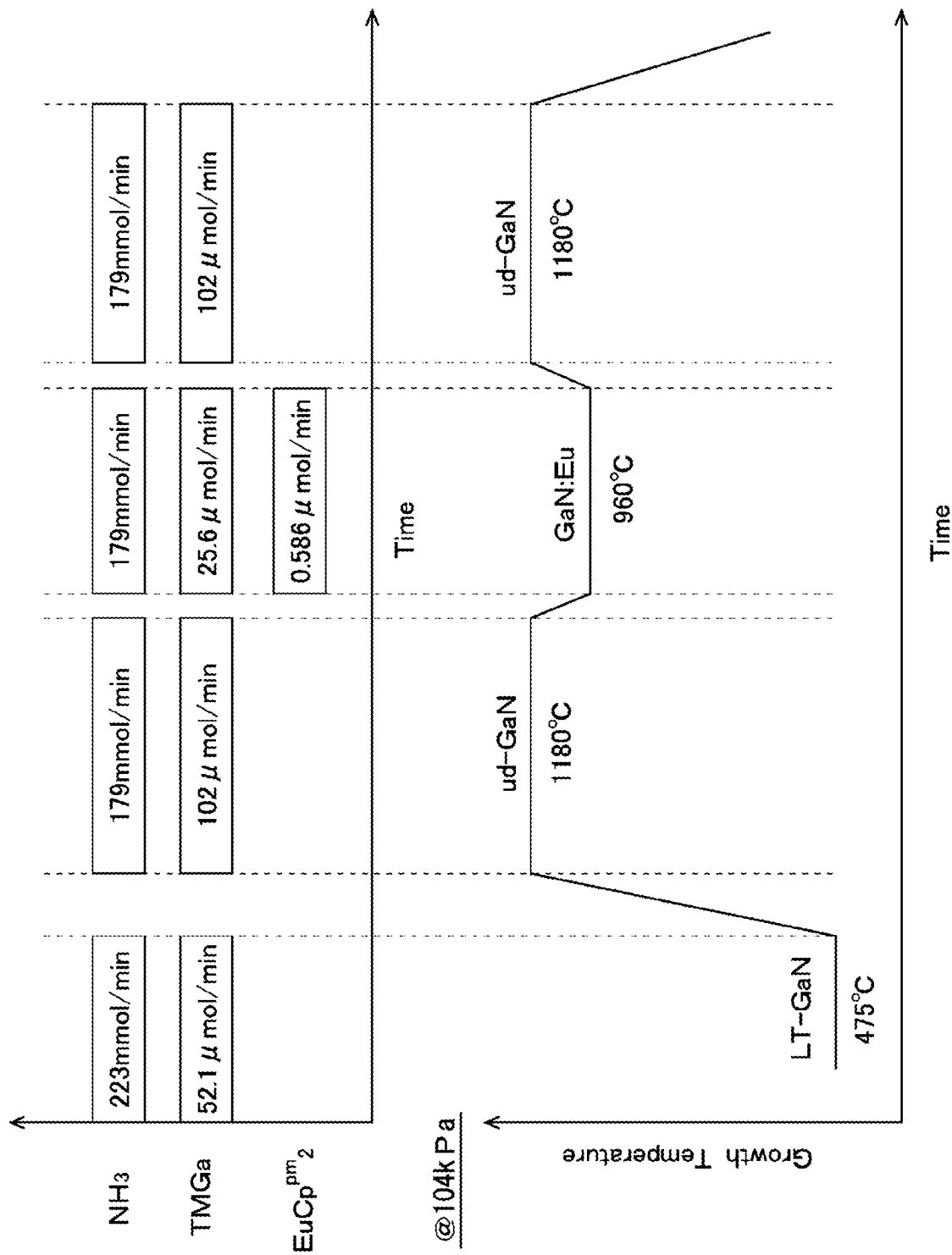
[FIG. 2]

[FIG. 3]
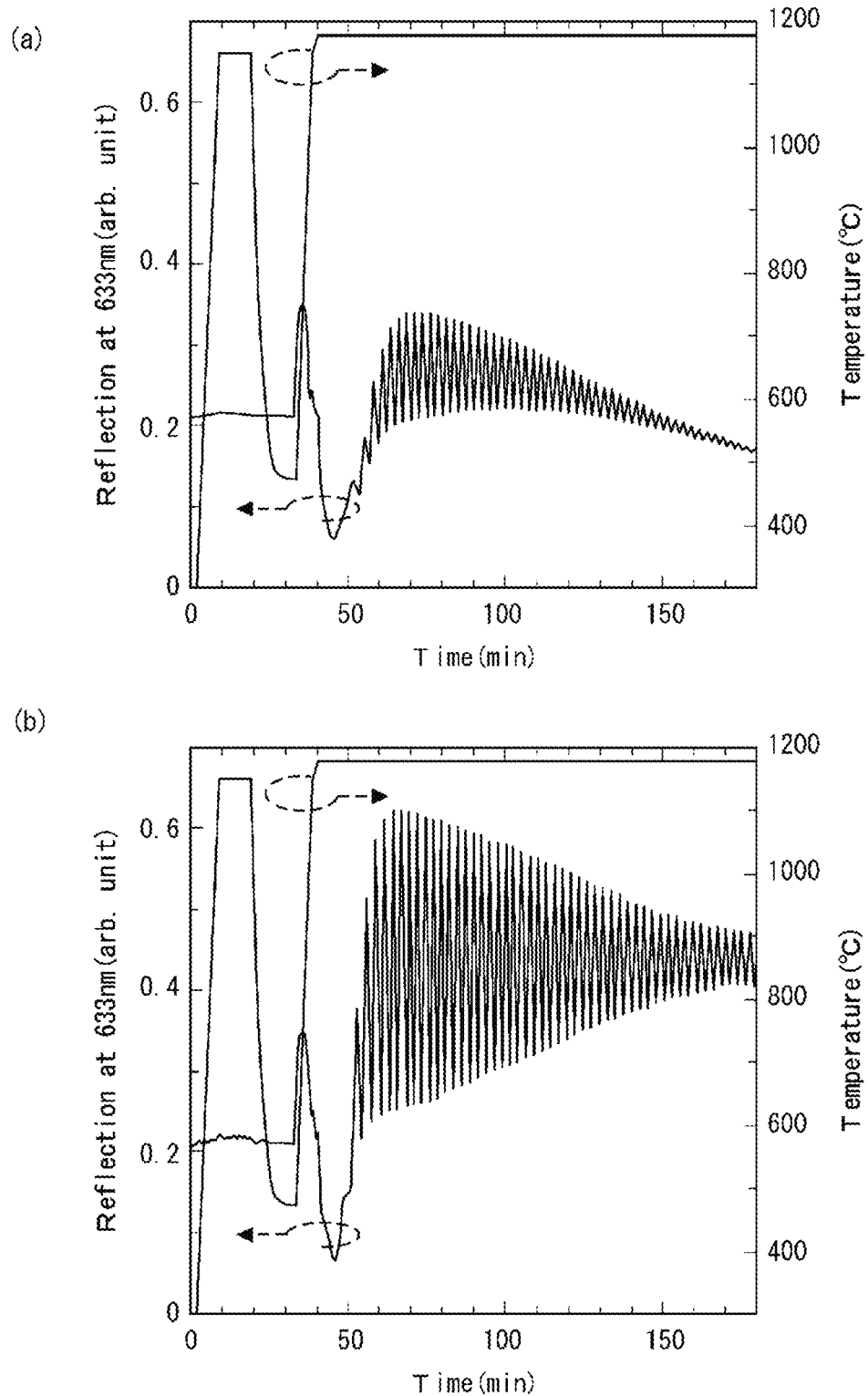

[FIG. 4]
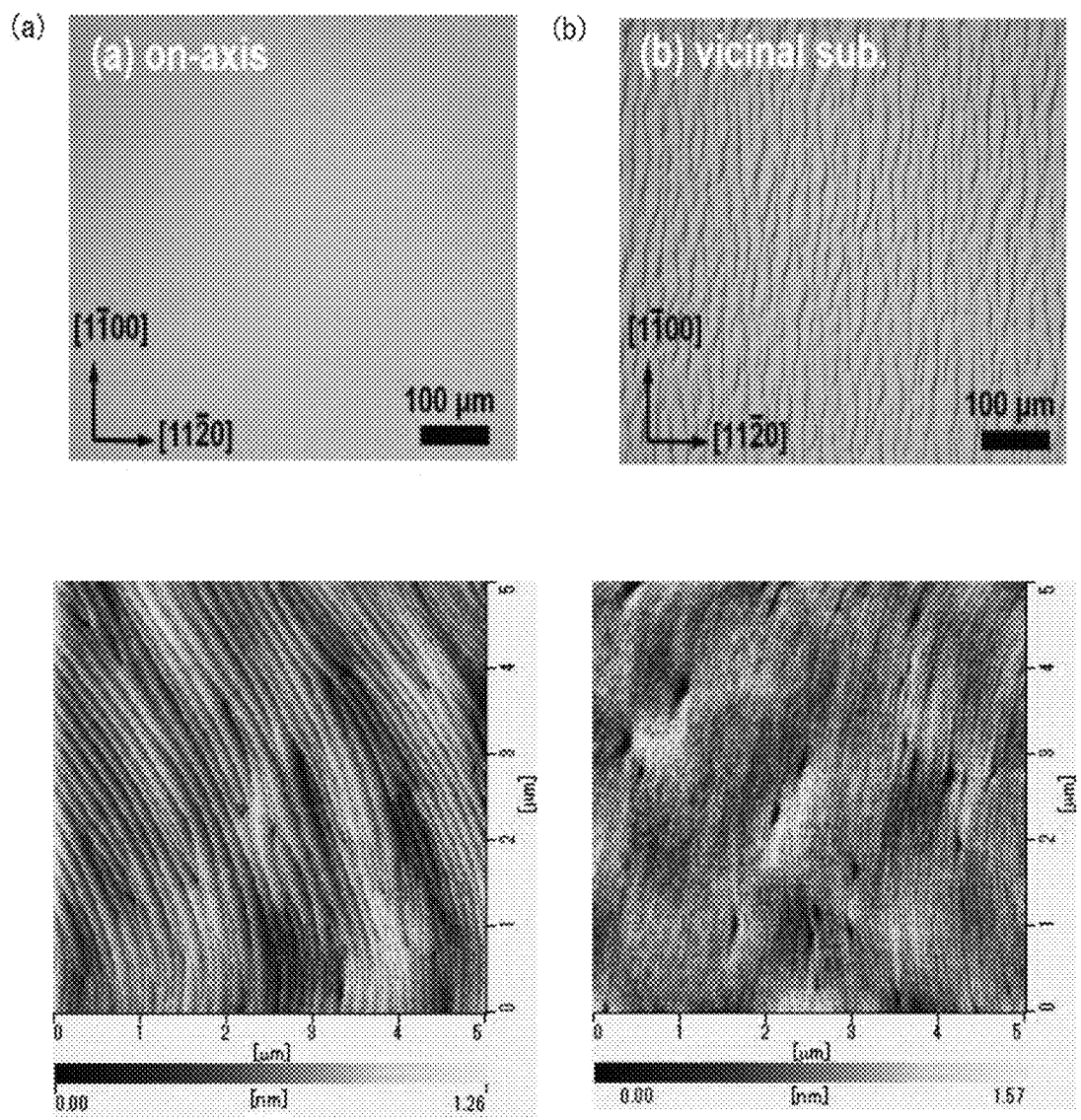

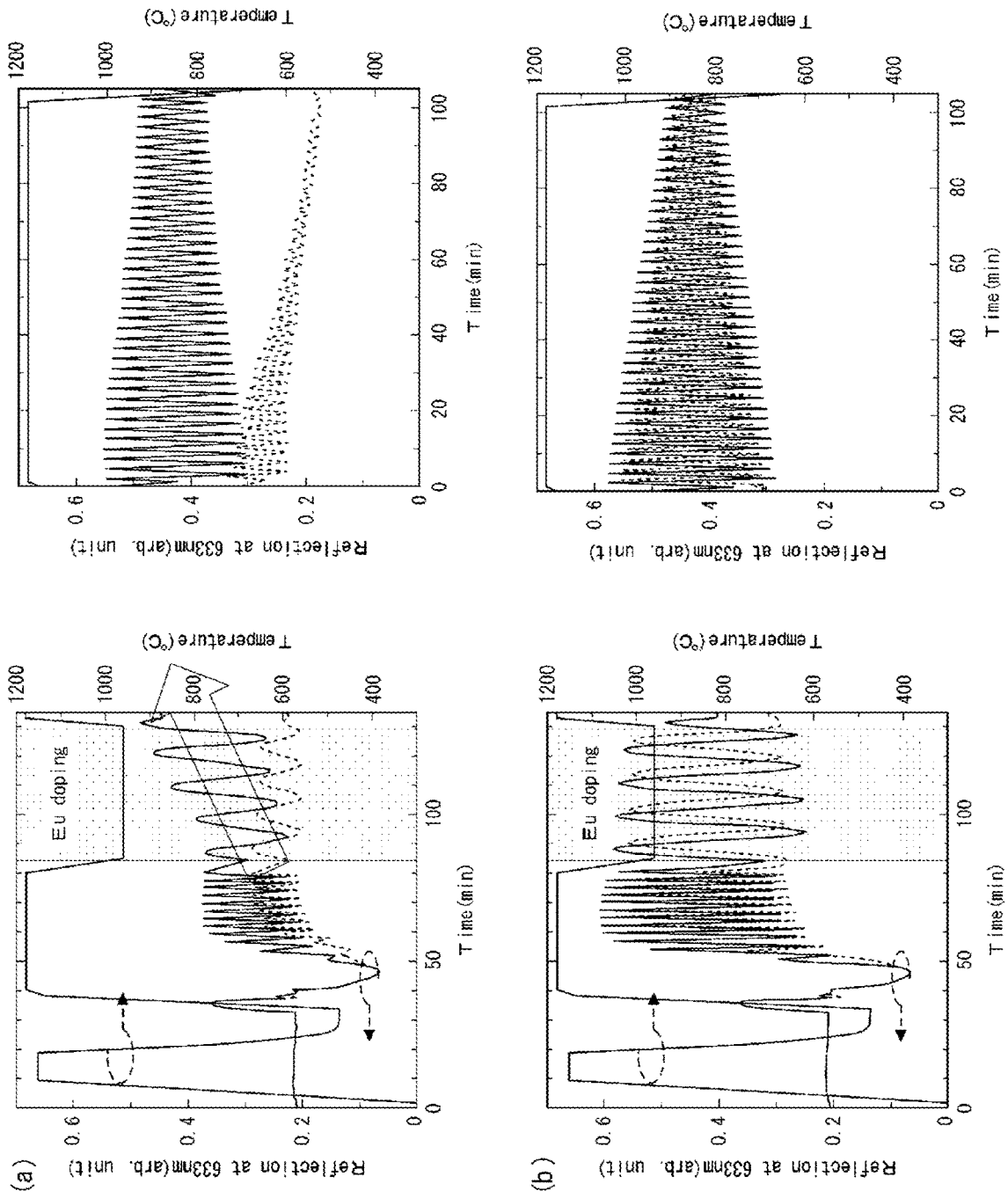
[FIG. 5]

[FIG. 6]
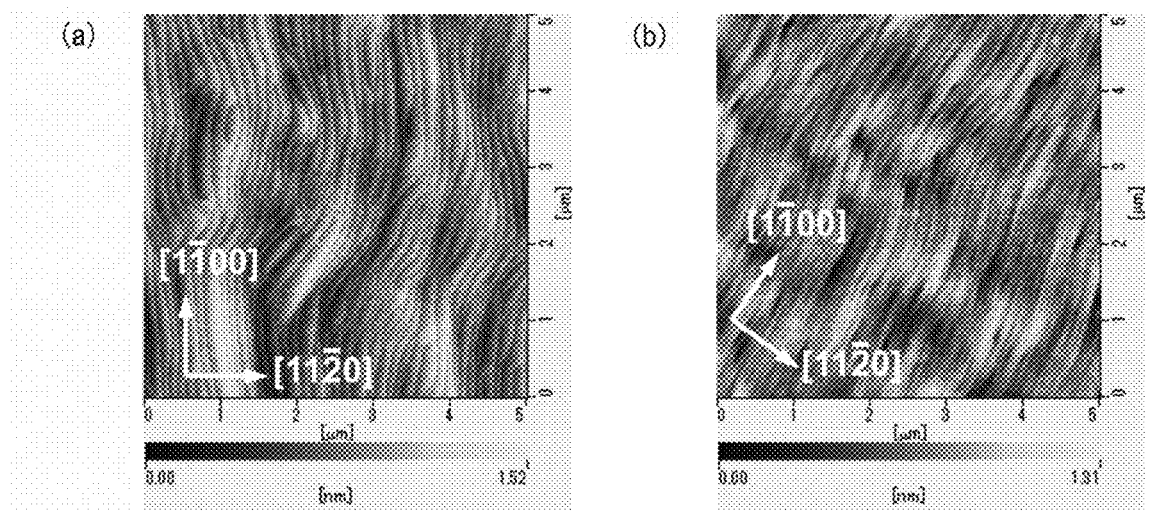
[FIG. 7]
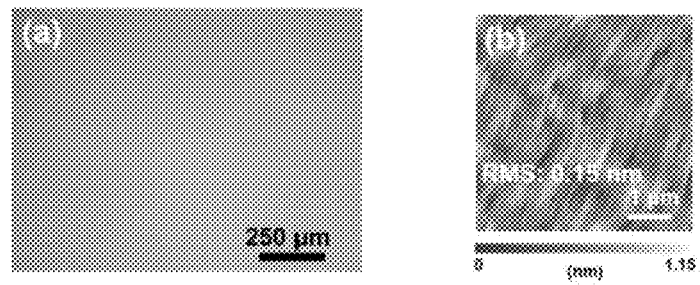
[FIG. 8]
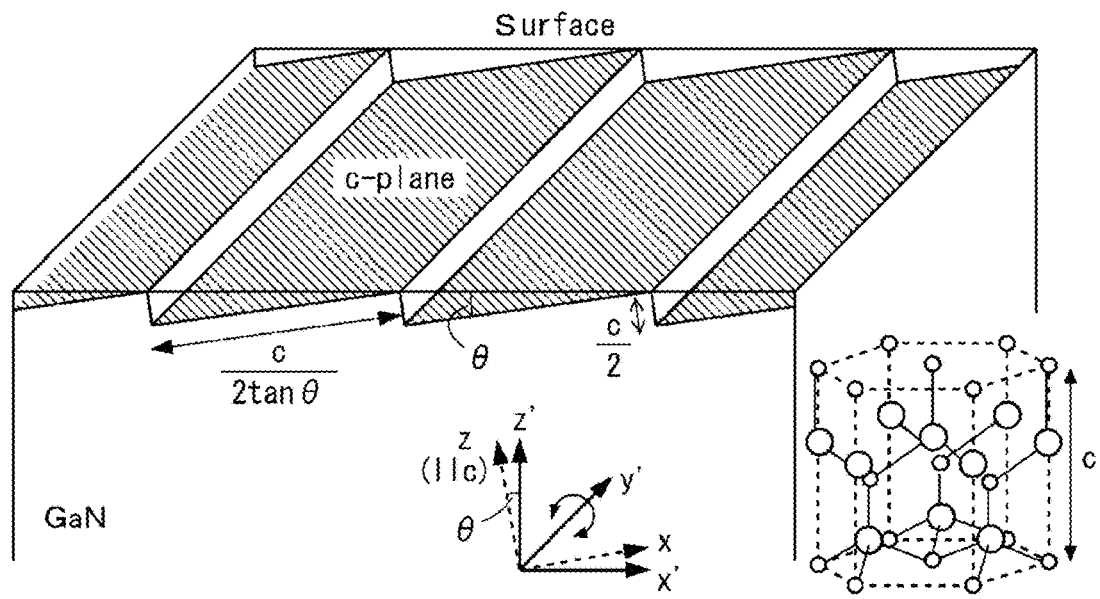

[FIG. 9]
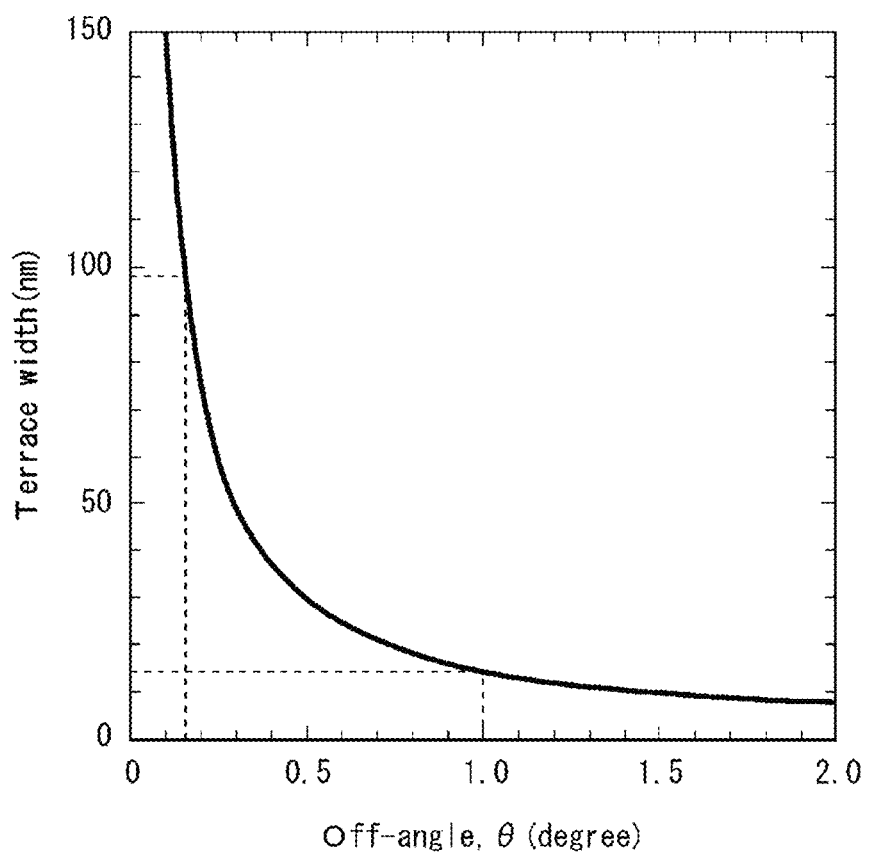

[FIG.10]
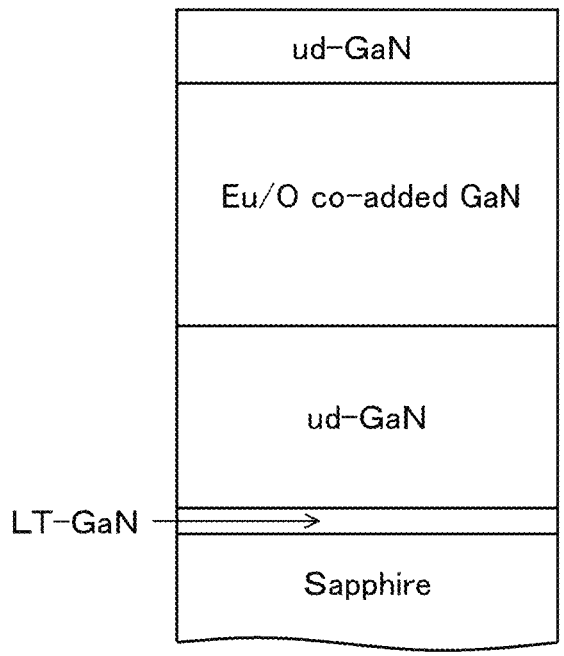

[FIG.11]
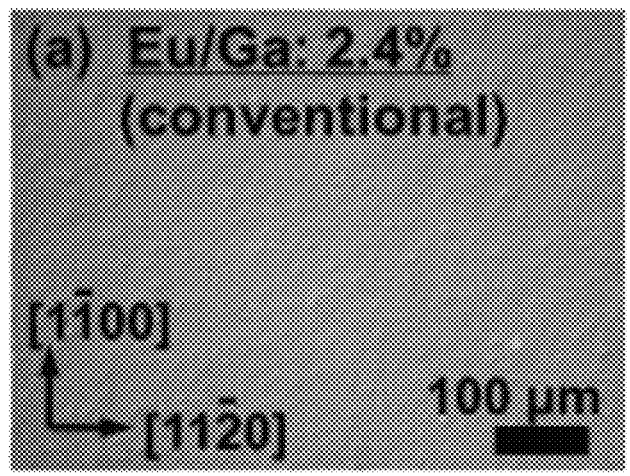
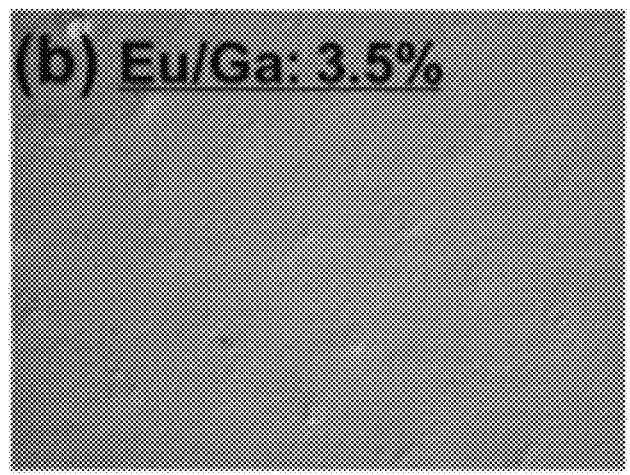
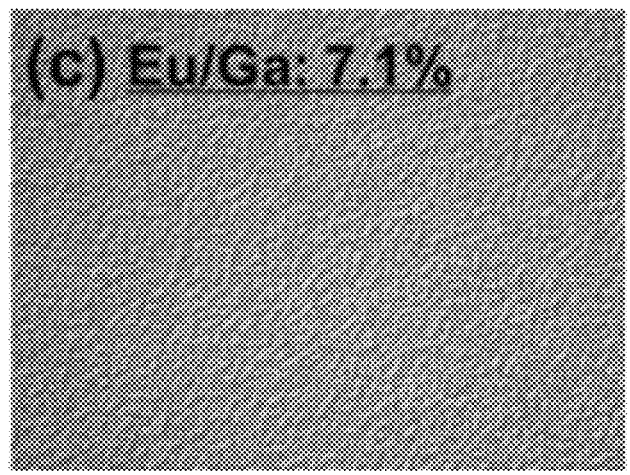

[FIG.12]
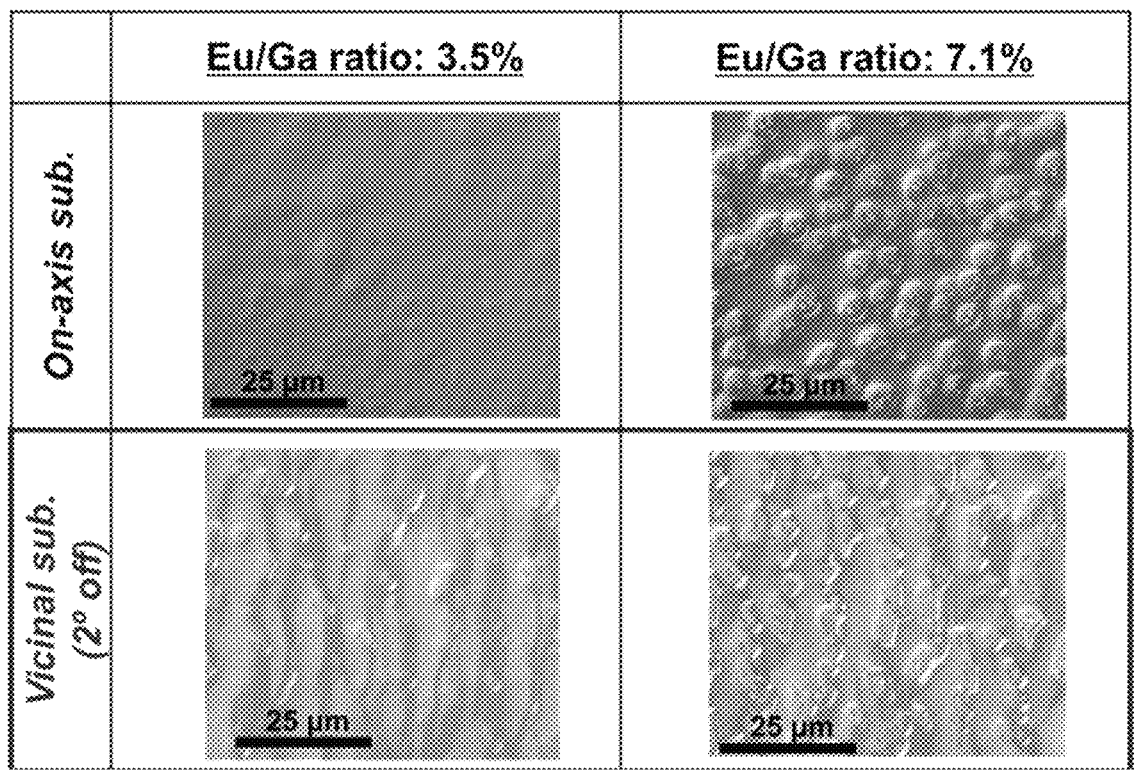

[FIG.13]
(a)
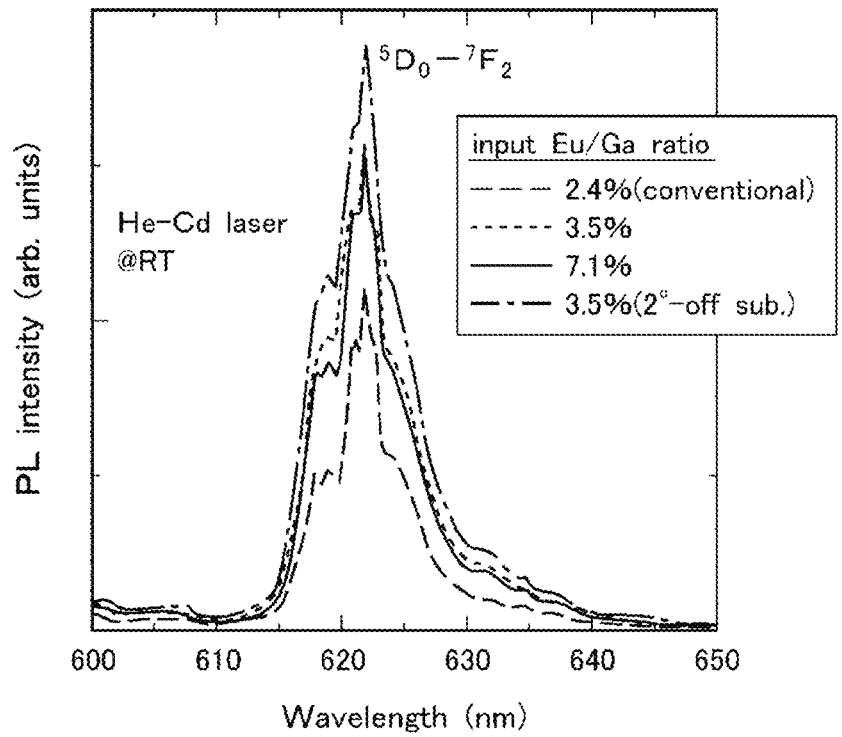
(b)
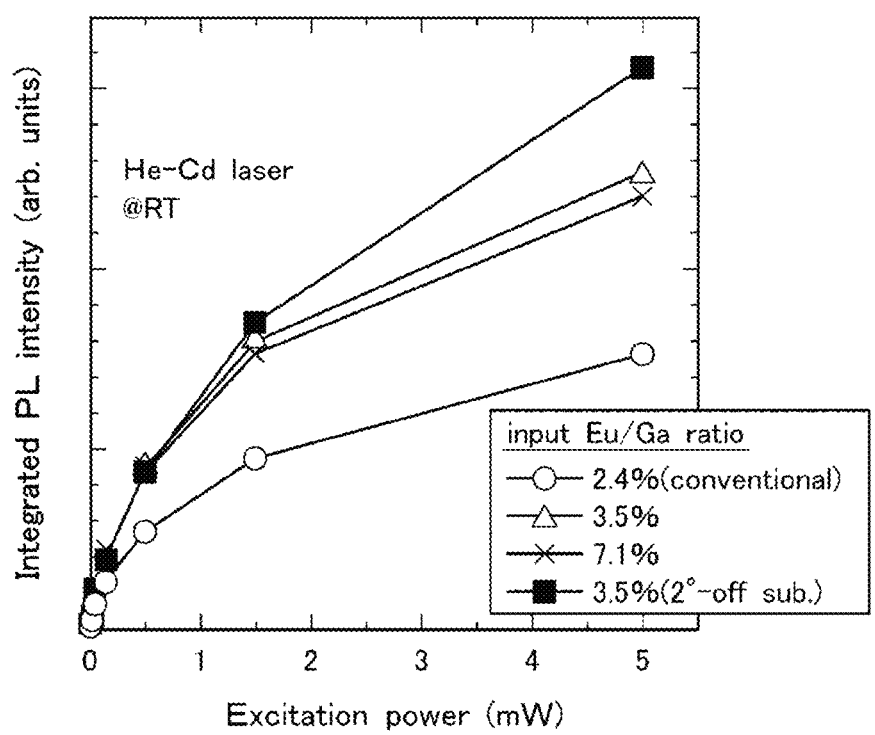

NITRIDE SEMICONDUCTOR DEVICE AND SUBSTRATE THEREOF, METHOD FOR FORMING RARE EARTH ELEMENT-ADDED NITRIDE LAYER, AND RED-LIGHT EMITTING DEVICE AND METHOD FOR MANUFACTURING THE SAME

TECHNICAL FIELD

The present invention relates to a nitride semiconductor device and a substrate thereof; a method for forming a rare earth element-added nitride layer; and a red-light emitting device and a method for manufacturing the same.

BACKGROUND OF THE INVENTION

In recent years, light emitting devices such as light emitting diodes (LED: Light Emitting Diode) and laser diodes (LD: Laser Diode) have come to be widely used. For example, LEDs are used for various display devices, backlights for liquid crystal displays including for mobile phones, white lighting, etc., while LDs are used for Blu-ray discs as light sources for recording and playback of high-definition video, optical communication, CDs, DVDs, etc.

Recently, applications are expanding for high-frequency devices such as MMICs (monolithic microwave integrated circuits) for mobile phones, HEMTs (high electron mobility transistors), and for high power devices such as power transistors for inverters for automobiles, schottky barrier diodes (SBDs), etc.

The semiconductor elements constituting these devices are generally manufactured by forming a nitride semiconductor layer made of gallium nitride (GaN), aluminum nitride (AlN), indium nitride (InN), or the like on a substrate such as sapphire.

Conventionally, as a method for forming a nitride semiconductor layer on a substrate, a method of crystal-growing a nitride semiconductor layer on the (0001) (c plane) of the substrate has been generally adopted. However, the strain occurred during film formation may cause piezo polarization, which may cause a problem that initially expected device characteristics cannot be obtained. That is, the radiation recombination probability in the nitride semiconductor layer would decrease due to the internal electric field generated in the nitride semiconductor layer due to the occurrence of piezo polarization and the separation of the wave functions of electrons and holes; and, as a result, expected device characteristics may not be expressed.

Therefore, it has been studied to improve the device characteristics by demonstrating a plurality of advantages such as reduction of crystal defect density and improvement of light emission efficiency in the nitride semiconductor layer by a method where a substrate having a surface slightly inclined with respect to the c-plane (off-angle inclined substrate) is used, and the slightly inclined surface is used as a film forming surface to grow the crystal axis to the orientation of slightly inclined by several degrees from the [0001] direction (for example, Patent Document 1).

FIG. 8 is a diagram for explaining crystal growth using this off-angle inclined substrate. Ga is shown by a large circle in the lower right of FIG. 8. Ga is adsorbed along the central portion of adjacent c-planes separated by a distance c, and the GaN crystal grows. As shown in the lower center of FIG. 8, the c-plane is tilted by an angle θ. As a result, as shown in the upper part of FIG. 8, the step height (thickness of the Ga—N monolayer) on the off-angle inclined substrate becomes (c/2), and the terrace width (diffusible width of Ga atoms) becomes (c/2 tan θ).

However, it has become clear that a new problem arises in the case of this method. That is, if the off-angle is made too large in order to, for example, reduce the crystal defect density and dramatically improve the luminous efficiency, since the terrace width becomes sharply narrowed, a huge macro step appears with the step bunching mechanism and, as a result, designed device characteristics cannot be obtained when manufacturing nitride semiconductor light emitting devices and electronic devices.

FIG. 9 is a diagram specifically showing the relationship between the off-angle and the terrace width, in which the vertical axis is the terrace width and the horizontal axis is the off-angle θ. It can be seen from FIG. 9 that there is an inverse correlation between the sizes of the terrace width and the off-angle, and the terrace width narrows sharply from 99.0 nm to 14.9 nm simply by changing the off-angle θ from 0.15° to 1°. If the terrace width becomes too narrow, step bunching will occur, leading to the appearance of a macro step with a large step height.

When such a macro step appears, a strong composition distribution is occurred in the crystal at the time of forming a mixed crystal (for example, AlGaN) due to the difference in the uptake efficiency depending on the atomic species (for example, Ga) in the vicinity of the step, and it has a great influence on the device characteristics when manufacturing nanostructures, such as a quantum well structure that require control on a scale of several nm. In particular, in the field of light emitting devices, there are many problems in practical use, such as difficulty in strict control of the light emitting wavelength.

Further, even if the surface of the substrate is smoothed by polishing or etching, this macro step reappears when a nitride semiconductor layer is formed on the surface of the substrate, so that the device characteristics as designed cannot be obtained.

Therefore, in order to manufacture high-quality and high-performance nitride semiconductor light-emitting devices and electronic devices as designed, it is considered that crystal growth technology that maintains a flat surface without a macro step is indispensable, and a technique of adding indium (In) to a nitride has been proposed, for example (Non-Patent Document 1).

PRIOR ART DOCUMENTS

Patent Document

[Patent Document 1] JP2004-335635 A

Non-Patent Document

[Non-Patent Document 1] C. K. Shu, et al, "Isoelectronic In-doping effect in GaN films grown by metalorganic chemical vapor deposition", Appl. Phys. Lett. 73, 641 (1998)

SUMMARY OF INVENTION

Problems to be Solved by the Invention

However, it was found that the above-mentioned addition of In has various problems. For example, the addition of In may cause a formation of InGaN by mixed crystallization with GaN, and the formation of InGaN may cause occurrences of lattice strain and crystal defects, so that strict flow rate control is required. In addition, continuous addition of In is required for removal of a macro step.

Therefore, the present invention is to provide a nitride semiconductor layer manufacturing technology that can stably supply high-quality semiconductor devices, in which, unlike the case using In, there is no fear of causing occurrence of lattice strain or crystal defects by mixing with GaN, and the occurrence of a macro step is prevented by using materials that do not require continuous addition, when a nitride semiconductor layer is formed on an off-angle inclined substrate to manufacture a semiconductor device Means for Solving the Problems The present inventor has succeeded for the first time in the world in producing a red-light emitting diode having a GaN layer to which Eu, one of rare earth elements, is added (Eu-added GaN layer), as a light emitting layer, and has reached an unrivaled range regarding the organic metal vapor phase epitaxial method (OMVPE method) of the Eu-added GaN layer controlled at the atomic level.

The present inventors found that the surface of the Eu-added GaN layer was flattened in the process, and Eu has a surfactant effect. Therefore, the present inventors thought that, when a nitride semiconductor thin film is formed on an off-angle inclined substrate to manufacture a semiconductor device, and an Eu-added GaN layer is provided on the off-angle inclined substrate as a base treatment layer, the surfactant effect of Eu is exhibited and it might be possible to prevent the occurrence of a macro step in the growth of the nitride semiconductor layer; and the present inventors have conducted various experiments and studies.

As a result, even at a low addition concentration of 1 at % or less of Eu, a macro step on the surface of the off-angle inclined substrate is dramatically reduced during the growth of the Eu-added GaN layer; and even when, on the Eu-added GaN layer, an Eu-free GaN layer is grown with a thickness exceeding 5 μm, a macro step does not occur, a flat surface is formed at the atomic level, and the effect of surface flattening by Eu addition is maintained. Thus, it turned out that academically very interesting results were obtained.

Although the mechanism by which the addition of Eu prevents the occurrence of a macro step is currently being elucidated, it is presumed that while the addition of In promotes the diffusion of Ga atoms for smoothing, Eu exerts an excellent surfactant effect, inhibits the diffusion of Ga and prevents the occurrence of a macro step, and, as a result, the surfaces of the Eu-added GaN layer and the EU-free GaN layer formed on it are smoothed.

And, unlike the addition of In, the addition of Eu at a low addition concentration of 1 at % or less described above does not require continuous addition. Further, Eu at a low addition concentration is added so as to locally replace Ga of GaN, not to mix with GaN, like that In mixes with GaN and forms InGaN. Therefore, there is no fear to cause the occurrence of crystal defects, and strict flow control is not required.

It can be said that the fact that strict flow rate control and continuous addition are not required is of great significance in the actual production of nitride semiconductor devices.

In the present invention, by providing the Eu-added GaN layer as the base treatment layer, it is possible to prevent the occurrence of a macro step, and to stably supply nitride semiconductor devices suitable not only for light emitting devices but also for high frequency devices and high power devices.

Further experiments and studies were conducted on the preferable addition concentration of Eu and on the preferable thickness of the Eu-added GaN layer; and as a result, it was found that the preferable addition concentration of Eu in the Eu-added GaN layer was 0.001 to 10 at %, and the preferable thickness of the Eu-added GaN layer was 0.1 nm or more. Although the upper limit of the thickness of the Eu-added GaN layer is not particularly specified, it is considered that a sufficient effect can be obtained if the thickness is about 2 μm in consideration of the saturation of surface smoothing associated with the surfactant effect of Eu.

In the above description, GaN is used as the nitride and Eu is used as the additive element. However, as a result of further experiments and studies by the present inventors, it was found that nitrides so-called GaNs system nitrides such as AlN and InN other than GaN (including mixed crystals such as InGaN and AlGaN) can be handled in the same manner as the nitride because they have almost the same chemical properties as GaN. The additive element is not limited to Eu, and it was found that the same excellent surfactant effect is exhibited under the same conditions as Eu, if it is a rare earth element selected from Sc, Y and lanthanoid elements from La to Lu, which have almost the same chemical properties as Eu.

In addition, as a result of examination on the substrate, it turned out that the same surfactant effect can be obtained by providing a rare earth element-added nitride layer such as an Eu-added nitride layer even if, beside sapphire, SiC or Si is used as the substrate. Since SiC has high thermal conductivity and excellent heat dissipation, it is suitable for manufacturing high power devices. Since Si is inexpensive and a large size can be easily obtained, it is preferable for manufacturing a nitride semiconductor device at a low price. It is also preferable to use a nitride semiconductor composed of GaN, InN, AlN, or a mixed crystal of any two or more of these.

The inventions according to claims 1 to 7 were completed based on the above findings, and the invention according to claim 1 is a nitride semiconductor device configured by providing a nitride semiconductor layer on a substrate, characterized in that
  the substrate is an off-angle inclined substrate,
  a rare earth element-added nitride layer to which a rare earth element is added is provided on the substrate as a base treatment layer to prevent the occurrence of a macro step and to flatten the surface, and
  a nitride semiconductor layer is provided on the rare earth element-added nitride layer.

The invention according to claim 2 is the nitride semiconductor device according to claim 1, characterized in that
  the rare earth element-added nitride layer is a layer in which the rare earth element is added to GaN, InN, AlN, or a mixed crystal of any two or more of these.

The invention according to claim 3 is the nitride semiconductor device according to claim 1 or 2, characterized in that the addition concentration of the rare earth element in the rare earth element-added nitride layer is 0.001 to 10 at %.

The invention according to claim 4 is the nitride semiconductor device according to any one of claims 1 to 3, characterized in that the thickness of the rare earth element-added nitride layer of 0.1 nm or more.

The invention according to claim 5 is the nitride semiconductor device according to any one of claims 1 to 4, characterized in that the rare earth element is Eu.

The invention according to claim 6 is the nitride semiconductor device according to any one of claims 1 to 5, characterized in that the substrate is made of sapphire, SiC, Si, or GaN, InN, AlN or a mixed crystal of any two or more of GaN, InN and AlN.

The invention according to claim 7 is the nitride semiconductor device according to any one of claims 1 to 6, which is any one of a light emitting device, a high frequency device and a high-power device.

In the above, the nitride semiconductor device is manufactured by providing the rare earth element-added nitride layer as the base treatment layer on the off-angle inclined substrate and then providing the rare earth element free nitride semiconductor layer. However, the same effect can be obtained even when a material in which a rare earth element-added nitride layer is formed on an off-angle inclined substrate is produced in advance as a substrate and is provided to a third party, and then the third party provided the substrate produces a nitride semiconductor device by growing a rare earth element free nitride semiconductor layer on the substrate provided with the rare earth element-added nitride layer.

That is, the invention according to claim 8 is a substrate used for manufacturing a nitride semiconductor device, in which a rare earth element-added nitride layer to which a rare earth element is added is provided on an off-angle inclined substrate, as a base treatment layer to prevent the occurrence of a macro step and to flatten the surface.

The invention according to claim 9 is the substrate according to claim 8, characterized in that the rare earth element-added nitride layer is a layer in which the rare earth element is added to GaN, InN, AlN, or a mixed crystal of any two or more of these.

The invention according to claim 10 is the substrate according to claim 8 or 9, characterized in that the addition concentration of the rare earth element in the rare earth element-added nitride layer is 0.001 to 10 at %.

The invention according to claim 11 is the substrate according to any one of claims 8 to 10, characterized in that the thickness of the rare earth element-added nitride layer is 0.1 nm or more.

The invention according to claim 12 is the substrate according to any one of claims 8 to 11, characterized in that the rare earth element is Eu.

The invention according to claim 13 is the substrate according to any one of claims 8 to 12, characterized in that the off-angle inclined substrate is a nitride semiconductor made of sapphire, SiC or Si, or GaN, InN, AlN or a mixed crystal of any two or more of GaN, InN and AlN.

The above-mentioned nitride layer for the nitride semiconductor device and substrate according to the present invention can be produced by forming a rare earth element-free nitride layer and a rare earth element-added nitride layer on an off-angle inclined substrate in a series of steps without taking them out from the reaction vessel on the way while changing the temperature conditions by using the organic metal vapor phase epitaxial method (OMVPE method).

The lattice constants are different between the off-angle inclined substrate and the nitride layer, as between sapphire and GaN, and, considering the propagation of crystal defects in the off-angle inclined substrate, it is preferable that a rare earth element-free nitride layer is provided between the off-angle inclined substrate and the rare earth element-added nitride layer. Therefore, the rare earth element-free nitride layer is formed prior to the formation of the rare earth element-added nitride layer. Specifically, it is preferable to provide two types of the rare earth element-free nitride layer, that is; rare earth element-free LT (Low Temperature)-nitride layer, which is grown at low temperature, and rare earth element-free ud (Undoped)-nitride layer, which is grown at high temperature.

By providing the LT-nitride layer, it is possible to match the lattice constants of the off-angle inclined substrate and the nitride layer and prevent the occurrence of cracks. And, by providing the ud-nitride layer, dislocations, which are crystal defects, can be suppressed, and high-quality nitride crystals can be obtained.

Specifically, first, the LT-nitride layer and the ud-nitride layer are formed as the rare earth element-free nitride layer on the off-angle inclined substrate in the same manner as in the conventional case. After that, the temperature is changed to 900 to 1100° C., and a rare earth element-added nitride layer is formed on the rare earth element-free nitride layer.

At this time, the surface of the rare earth element-added nitride layer is flattened by the surfactant effect of the added rare earth element. Therefore, even if a nitride semiconductor layer is provided on the rare earth element-added nitride layer as the base treatment layer to produce a nitride semiconductor device, a macro step does not occur and a nitride semiconductor device which exhibits excellent device characteristics can be stably supplied.

Then, the formations of the rare earth element-free nitride layer (LT-nitride layer, ud-nitride layer), the rare earth element-added nitride layer and the formation of the nitride semiconductor layer can be performed only by changing the temperature condition and setting whether or not to add the rare earth element during the growth of each nitride layer. Therefore, the formations can be performed in a series of steps without taking them out from the reaction vessel.

In the above, the nitride semiconductor device can also be manufactured by forming a rare earth element-added nitride layer first and then forming the nitride semiconductor layer using the rare earth element-added nitride layer as a substrate.

The inventions according to claims 14 to 17 were completed based on the above findings, and the invention of claim 14 is a method for forming a rare earth element-added nitride layer, where a rare earth element added nitride layer is formed on an off-angle inclined substrate; which has a step of forming a rare earth element-free nitride layer on the off-angle inclined substrate, and a step of forming a rare earth element-added nitride layer as a base treatment layer to prevent the occurrence of a macro step and to flatten the surface, on the rare earth element-free nitride layer; characterized in that each of the above steps is performed by a series of forming steps using an organic metal vapor phase epitaxial method without taking out from the reaction vessel, and the formation of the rare earth element-added nitride layer is performed at a temperature of 900 to 1100° C.

The invention according to claim 15 is a substrate characterized in that a rare earth element-free nitride layer and a rare earth element-added nitride layer as a base treatment layer to prevent the occurrence of a macro step and to flatten the surface are stacked in this order on an off-angle inclined substrate.

Further, the invention according to claim 16 is a method for manufacturing a nitride semiconductor device in which a nitride semiconductor layer is formed on the rare earth element-added nitride layer formed by using the method for forming a rare earth element-added nitride layer according to claim 14.

Further, the invention according to claim 17 is a nitride semiconductor device which is formed by stacking a rare earth element-free nitride layer, a rare earth element-added nitride layer, as a base treatment layer to prevent the occurrence of a macro step and to flatten the surface, and a nitride semiconductor layer in this order on an off-angle inclined substrate.

As described above, the present inventors have succeeded in producing a red-light emitting diode using an Eu-added GaN layer as an active layer (light emitting layer) for the first time in the world, but there is an increasing demand for further improvement of the light emitting intensity.

The present inventors have been studying further improvement of the light emission intensity of such a red-light emitting diode, have considered that a crystal growth technology capable of adding rare earth elements to high concentrations is indispensable, since high-concentration doping of rare earth elements directly contributes to the increase in light emission intensity in a light emitting device utilizing the light emission of rare earth ions, such as a red-light emitting diode having an Eu-added GaN layer as an active layer, and have conducted specific studies.

As a result, it was found that a strong step-flow growth mechanism was obtained, which enables high-concentration doping of Eu, when the crystal growth of the Eu-added GaN layer, which is the active layer, is performed, along the direction in which the crystal axis is slightly inclined from the [0001] direction, that is, using the off-angle inclined substrate, in the thin film growth of the nitride semiconductor.

Specifically, it was found that, when the Eu-added GaN layer is grown on the slightly inclined surface of the off-angle inclined substrate, a strong step flow growth mechanism is induced and the step flow growth is promoted over the entire surface, so that, Eu is efficiently incorporated into the active layer, the Eu-added GaN layer grows while maintaining the quality (high crystallinity) of the GaN film, and extremely excellent emission intensity was obtained, even if the Eu/Ga flow ratio (Eu/Ga ratio) exceeds 2.4%, which has been considered as the optimum growth condition for the growth of the Eu-added GaN layer on an on-axis substrate.

That is, in the growth of the Eu-added GaN layer on the conventional on-axis substrate, a peculiar hillock structure is easily appeared on the surface as the Eu-added concentration increases, resulting in a rough growth surface. As a result, the improvement of the emission intensity was hindered due to the deterioration of the crystal quality. Further, under high current injection, that is, under a high excitation state, the emission intensity is saturated, which causes a so-called efficiency droop phenomenon. For this reason, conventionally, in the formation of the Eu-added GaN layer, 2.4% of the Eu/Ga ratio was considered to be the optimum growth condition.

In the present invention, as described above, since the Eu-added GaN layer is grown on the off-angle inclined substrate by increasing the Eu/Ga ratio, the formation of a hillock structure due to the addition of Eu is suppressed, the Eu-added GaN layer in which Eu is incorporated at a high concentration is formed, and extremely excellent emission intensity can be obtained.

When O is co-added together with Eu, the fluctuation of the local structure around Eu in the active layer drastically reduces, the emission spectrum (PL spectrum) sharpens, and the emission intensity further improves. Therefore, the Eu-added GaN layer is preferably an Eu/O co-added GaN layer.

Such a red-light emitting device may be manufactured by using the off-angle inclined substrate that has been subjected to the above-mentioned base treatment in advance, but it is preferable to form the Eu-added GaN layer directly on the off-angle inclined substrate in view of the fact that the base treatment layer is also an Eu-added GaN layer.

That is, the Eu-added GaN layer formed at the beginning functions as the base treatment layer of the off-angle inclined substrate, and the Eu-added GaN layer, formed on the layer formed at the beginning, functions as the active layer. Therefore, the base treatment and the formation of the active layer can be proceeded as a series of steps, while maintaining the environment for the base treatment, and the active layer can be formed more efficiently. Further, since Eu can be used effectively, a high material gain can be obtained.

Such a remarkable improvement in emission intensity can be similarly obtained by using Pr instead of Eu as the added rare earth element. In this case as well, the Pr-added GaN layer can be directly formed on the off-angle inclined substrate, but it is preferable to form the Pr-added GaN layer on the off-angle inclined substrate which has been subjected to the base treatment in advance.

The inventions according to claims 18 to 22 were completed based on the above findings, and the invention according to claim 18 is a red-light emitting device, characterized in that a rare earth element-added nitride layer in which Eu or Pr is added, as a rare earth element, to GaN, InN, AlN or a mixed crystal of any two or more of these is formed as an active layer, and the active layer is formed on the substrate according to any one of claims 8 to 13.

The invention according to claim 19 is a red-light emitting device, characterized in that a rare earth element-added nitride layer, in which Eu is added as a rare earth element to GaN, InN, AlN or a mixed crystal of any two or more of these, is formed on an off-angle inclined substrate as a base treatment layer to prevent the occurrence of a macro step and to flatten the surface.

The invention according to claim 20 is a red-light emitting device according to claim 18 or 19, characterized in that the rare earth element-added nitride layer is a rare earth element-added nitride layer to which oxygen is co-added.

The invention according to claim 21 is the method for manufacturing a red-light emitting device according to claim 19, wherein the rare earth element-added nitride layer in which Eu is added is formed on an off-angle inclined substrate by using an organometallic vapor phase epitaxial method.

Effect of the Invention

According to the present invention, when a nitride semiconductor layer is formed on an off-angle inclined substrate to manufacture a semiconductor device, there is no fear of being mixed with GaN and causing lattice strain or crystal defects, unlike the case using In. Further, since the occurrence of a macro step is prevented by using a material that does not require continuous addition, it is possible to provide a technique for manufacturing a nitride semiconductor layer capable of stably supplying a high-quality semiconductor device.

BRIEF DESCRIPTION OF THE DRAWINGS

FIG. 1 A schematic diagram showing the configuration of the nitride semiconductor device according to one embodiment of this invention.

FIG. 2 A figure showing the formation profile of the nitride semiconductor device according to one embodiment of this invention.

FIG. 3 A figure showing the result of in-situ observation of the reflection intensity from the surface by the laser irradiation to the growing GaN layer in one embodiment of this invention, in which (a) shows the observation results for the off-angle inclined substrate and (b) shows the observation results for the on-axis substrate.

FIG. 4 A figure showing the results of observation of the surface of each Eu-free GaN layer after growth with an optical microscope (upper stage) and an AFM microscope (lower stage) in one embodiment of this invention, in which (a) shows the observation results for the on-axis substrate and (b) shows the observation results for the off-angle inclined substrate.

FIG. 5 A figure showing the result of in-situ observation of the reflection intensity of the laser irradiated to the growing GaN layer in one embodiment of this invention, in which (a) shows the observation results for the off-angle inclined substrate and (b) shows the observation results for the on-axis substrate.

FIG. 6 A figure showing the result of observation of the surface of the cap layer with an AFM microscope in one embodiment of this invention, in which (a) shows the observation results for the on-axis substrate and (b) shows the observation results for the off-angle inclined substrate.

FIG. 7 A figure showing the result of observation of the surface of the sample provided with the Eu-added GaN layer on the off-angle inclined substrate in one embodiment of this invention with (a) an optical microscope or (b) AFM microscope.

FIG. 8 A figure for explaining the crystal growth using the off-angle inclined substrate.

FIG. 9 A figure which showing the relationship between the off-angle and the terrace width.

FIG. 10 A schematic diagram showing the configuration of the red-light emitting device in which the Eu-added GaN layer is formed.

FIG. 11 An optical microscope image of the surface of the Eu/O co-added GaN layer formed by using the on-axis substrate.

FIG. 12 A figure for explaining the difference between the surface states of the Eu/O co-added GaN layers formed by using the off-angle inclined substrate and the on-axis substrate.

FIG. 13 A figure showing the measurement results, at room temperature, of the PL spectrum of the red-light emitting device in which the Eu-added GaN layer is formed on the on-axis substrate or on the off-angle inclined substrate, and (a) shows the relationship between the PL spectrum intensity (a.u.) and the wavelength (nm), (He—Cd laser, when excited at 5 mW), and (b) shows the relationship between the excitation force (mW) and the PL integrated intensity (a.u.) at a wavelength of 610 to 650 nm.

EMBODIMENTS OF THIS INVENTION

Hereinafter, the present invention will be described with specific embodiments with reference to the drawings. In the following description, the present invention will be described taking a sapphire substrate as an example of off-angle inclined substrate, GaN as an example of a nitride, and Eu as an example of rare earth element, but the present invention is not limited to these examples.

1. Nitride Semiconductor Device

FIG. 1 is a schematic diagram showing a configuration of a nitride semiconductor device according to the present embodiment. In FIG. 1, 10 is a sapphire substrate, 40 is an Eu-added GaN layer (GaN:Eu), and a cap layer 50 is formed on the Eu-added GaN layer 40. The cap layer 50 is an Eu-free GaN layer (ud-GaN) that serves as a nitride semiconductor layer.

In the present embodiment, the Eu-added GaN layer 40 to which Eu is added, which exhibits an excellent surfactant effect, is provided as the base treatment layer for forming the cap layer 50, so that the cap layer 50 can be grown on the Eu-added GaN layer 40 where the occurrence of a macro step is prevented, and the growth can be performed while forming a flat surface at the atomic level, even if the thickness exceeds 5 µm. Then, the originally expected effect of crystal growth by using the off-angle inclined substrate can be fully exhibited, and the device characteristics can be improved.

As described above, in the present embodiment, the effect of surface flattening in the Eu-added nitride layer provided as the base treatment layer is maintained in the cap layer (nitride semiconductor layer) formed in the upper layer. Therefore, nitride semiconductor devices suitable not only as light emitting devices but also as high frequency devices and high power devices can be stably supplied.

In the present embodiment, as shown in FIG. 1, are provided two types of Eu-free GaN layers of an LT-GaN layer 20 grown at a low temperature of about 475° C. and Eu-free GaN layer (ud-GaN) 30 grown at a high temperature of about 1180° C. between the sapphire substrate 10 and the Eu-added GaN layer 40. As described above, by providing the LT-GaN layer 20, it is possible to match the lattice constants of the sapphire crystal and the GaN crystal and prevent the occurrence of cracks. Then, by providing the ud-GaN layer 30, it is possible to suppress the influence of dislocations, which are crystal defects, and control the occurrence of defects in the Eu-added GaN layer.

2. Method for Forming Nitride Semiconductor Device

Next, the method for forming the above-mentioned nitride semiconductor device will be described. FIG. 2 is a diagram showing a formation profile of a nitride semiconductor device according to the present embodiment. In FIG. 2, the upper row shows the gas supplied as raw material and the supply rate, and the lower row shows the relationship between the growth temperature (vertical axis) and time (horizontal axis).

In the present embodiment, the OMVPE method was used in forming the nitride semiconductor device. Trimethylgallium (TMGa) was used as the Ga raw material, and ammonia ($NH_3$) was used as the N raw material. Further, as the Eu raw material, normal propyltetramethylcyclopentadienyl europium (Eu $[C_5(CH_3)_4(C_3H_7)]_2$: $EuCp^{pm}_2$) bubbled with a carrier gas (hydrogen gas: $H_2$) was used.

Then, as shown in FIG. 1, the LT-GaN layer 20, the ud-GaN layer 30, the Eu-added GaN layer 40, and the cap layer 50 were formed on the sapphire substrate 10 in this order according to the profile shown in FIG. 2. Hereinafter, a specific description will be given with reference to FIGS. 1 and 2.

(1) Formation of LT-GaN Layer 20

First, the sapphire substrate 10 inclined at an off-angle of 1° was placed in the reaction vessel adjusted to a pressure of 104 kPa, and then the temperature inside the reaction vessel was set to 475° C., $NH_3$ gas (223 mmol/min) and TMGa gas (52.1 µmol/min) were supplied into the reaction vessel.

Thus, the LT-GaN layer 20 having a thickness of 30 nm was formed on the sapphire substrate 10 at a growth rate of 1.3 µm/h.

(2) Formation of ud-GaN Layer 30

Next, the temperature inside the reaction vessel was set to 1180° C., $NH_3$ gas (179 mmol/min) and TMGa gas (102 µmol/min) were supplied into the reaction vessel, and the ud-GaN layer 30 having a thickness of 2 µm was formed on the LT-GaN layer 20 at a growth rate of 3.2 µm/h.

(3) Formation of Eu-Added GaN Layer 40

Next, the temperature inside the reaction vessel was set to 960° C., $NH_3$ gas (179 mmol/min), TMGa gas (25.6 µmol/min), and $EuCp^{pm}_2$ gas (0.586 µmol/min) were supplied into the reaction vessel, and the Eu-added GaN layer 40 having a thickness of 40 nm was formed on the ud-GaN layer 30 at a growth rate of 0.78 µm/h.

(4) Formation of Cap Layer 50

Next, the temperature inside the reaction vessel was set to 1180° C. again, $NH_3$ gas (179 mmol/min) and TMGa gas (102 µmol/min) were supplied into the reaction vessel, and the cap layer 50 having a thickness of 5 µm was formed on the Eu-added GaN layer 40 at a growth rate of 3.2 µm/h to form a nitride semiconductor device.

In the above, $EuCp^{pm}_2$, which has a high vapor pressure, was used as a raw material for Eu, but Eu $(C_{11}H_{19}O_2)_3$, $Eu[C_5(CH_3)_5]_2$, $Eu[C_5(CH_3)_4H]_2$, etc. may be used.

3. Evaluation (1) Confirmation of Occurrence of Macro Step on Off-Angle Inclined Substrate As an evaluation sample, an Eu-free GaN layer was grown to a thickness of 7.6 µm using the OMVPE method on a sapphire substrate (off-angle inclined substrate) inclined at an off-angle of 1°. On the other hand, for comparison, an Eu-free GaN layer having a thickness of 7.6 µm was similarly grown on a non-tilted sapphire substrate (on-axis substrate).

Then, each growing GaN layer was irradiated with a laser having a wavelength of 633 nm, and the intensity of reflection from the surface was observed on the spot. The results are shown in FIG. 3. In FIG. 3, (a) is an observation result on an off-angle inclined substrate and (b) is an observation result on an on-axis substrate. In each of (a) and (b), the vertical axis on the left side is the reflection intensity (arb. unit), the vertical axis on the right side is crystal growth temperature (° C.) and the horizontal axis is crystal growth time (min).

In the case of the on-axis substrate, as shown in FIG. 3(b), the reflection intensity is high as a whole, and a constant level is maintained even if the crystal growth time is long. On the other hand, in the case of the off-angle inclined substrate, as shown in FIG. 3(a), the reflection intensity is lowered as a whole, and the reflection intensity is further lowered as the crystal growth time becomes longer. It is considered that this is because the nitride layer was formed on the off-angle inclined substrate, so that the flatness on the surface of the nitride layer was low, and the flatness was further lowered as the film thickness was increased.

At the same time, the surface of each Eu-free GaN layer after growth was observed with an optical microscope and an AFM microscope (atomic force microscope), and the surface state thereof was evaluated. The results are shown in FIG. 4. In FIG. 4, the upper part shows the observation result by the optical microscope, and the lower part shows the observation result by the AFM microscope; and the left side is the observation result in (a) on-axis substrate, and the right side is (b) the observation result in the off-angle inclined substrate.

As shown in FIG. 4, in the case of the on-axis substrate, no macro step was observed and the surface was flat. On the other hand, in the case of the off-angle inclined substrate, a huge macro step occurred by the step bunching is observed, and a wavy structure is occurred on the surface to impair the flatness.

(2) Evaluation of Flatness in Eu-Free GaN Layer

Next, as an evaluation sample, an LT-GaN layer having a thickness of 30 nm, an ud-GaN layer having a thickness of 2 µm, an Eu-added GaN layer having a thickness of 40 nm, and a cap layer (ud-GaN layer) having a thickness of 5 µm were grown on the same substrates (off-angle inclined substrate and on-axis substrate) as those described above. On the other hand, for comparison, an ud-GaN layer was grown on each of the substrates until the total thickness became the same.

Then, in the same manner as described above, the reflection intensity during growth of each layer is observed in-situ, and the surface of each GaN layer on the uppermost layer after growth is observed with an AFM microscope and an optical microscope to evaluate the surface state.

FIG. 5 shows the observation result of the reflection intensity. In FIG. 5, the upper row is the observation result on the (a) off-angle inclined substrate, and the lower row is the observation result on the (b) on-axis substrate; and the left side is the observation result in the whole process, and the right side is the observation result during growth of the cap layer. The solid line is the observation result for the sample having the Eu-added GaN layer, and the broken line is the observation result for the sample having only the ud-GaN layer.

In the case of the on-axis substrate, as shown in FIG. 5(b), the reflection intensity in the sample having the Eu-added GaN layer does not significantly change from the reflection intensity in the sample having only the ud-GaN layer, and it is maintained at a certain level even if the crystal growth time becomes long. On the other hand, in the case of the off-angle inclined substrate, as shown in FIG. 5(a), by providing the Eu-added GaN layer, the reflection intensity is significantly improved as compared with the sample having only the ud-GaN layer. From this result, it can be seen that the growth of the Eu-added GaN layer has a great influence on the improvement of flatness when the cap layer is formed.

FIG. 6 shows the results of observing the surface of the cap layer with an AFM microscope. Here, the observation results in the samples provided with the Eu-added GaN layer are shown, (a) is for the case provided on the on-axis substrate and (b) is for the case provided on the off-angle inclined substrate.

From FIG. 6, it can be seen that, by providing the Eu-added GaN layer on the off-angle inclined substrate, the surface state becomes similar to the surface state for the case of on-axis substrate.

FIG. 7 shows the results of observing the surface of the sample provided with the Eu-added GaN layer on the off-angle inclined substrate with (a) an optical microscope and (b) an AFM microscope.

From FIG. 7, it can be seen that the surface of the cap layer is smoothed by providing the Eu-added GaN layer, and the surface roughness thereof becomes very small as RMS is 0.15 nm. This result shows that the addition of Eu prevents the occurrence of a macro step and forms a GaN layer having a flat surface at the atomic level, and indicates the excellent surfactant effect of Eu.

In the above, the surfactant effect has been described by giving an example in which an Eu-added GaN layer is grown on an off-angle inclined substrate and a cap layer is provided on the Eu-added GaN layer. The Eu-added GaN layer and the ud-GaN layer may be stacked a plurality of times as a pair, whereby the surface state can be further smoothed.

4. Application to Semiconductor Devices

As described above, in the present embodiment, by providing the Eu-added GaN layer on the off-angle inclined substrate, it becomes possible to provide a substrate having a low defect density. Therefore, it becomes possible to realize a blue/green LED having a dramatically higher luminous efficiency than the conventional one. Further, since the low dislocation density is realized on the off-angle inclined substrate, it is possible to realize an element having a small leakage current, and to manufacture a nitride power device with high reliability.

5. Red-Light Emitting Device

Next, the red light emitting device according to the present embodiment will be described in detail.

(1) Problems of the Conventional Technology

First, the problems in the growth of the Eu-added GaN layer on the conventional on-axis substrate will be explained. Specifically, why Eu/Ga ratio of 2.4% is considered as an optimum growth condition of the Eu-added GaN layer will be explained.

First, as an evaluation sample, a red-light emitting device was produced in which an Eu/O co-added GaN layer was formed on an on-axis substrate by changing the Eu/Ga ratio to 2.4%, 3.5% and 7.1%.

Specifically, first, an additive-free GaN layer (LT-GaN layer and ud-GaN layer) having a thickness of several μm was grown on an on-axis sapphire substrate, and then TMGa as a Ga raw material, $NH_3$ as an N raw material and $EuCp^{pm}_2$, bubbled with a carrier gas (supplied together with oxygen gas), as an Eu raw material were introduced at a predetermined Eu/Ga ratio to grow an Eu/O co-added GaN layer having a thickness of about 300 nm. Finally, an ud-GaN layer having a thickness of 10 nm was grown to complete the production of three types of red-light emitting devices (see FIG. 10).

FIG. 11 shows an optical microscope image of the surface of the Eu/O co-added GaN layer formed in each of the obtained three types of evaluation samples. From FIG. 11, it can be seen that, in the case of the on-axis sapphire substrate, the surface flatness is lost as the Eu/Ga ratio increases from 2.4%, 3.5% to 7.1%, and, in particular, the crystal growth surface deteriorates dramatically when the ratio is changed from 3.5% to 7.1%.

Then, in the upper part of FIG. 12, the surface state of the Eu/O co-added GaN layer obtained in each of the two cases of the Eu/Ga ratio of 3.5% and 7.1% is shown with the larger magnification of the optical microscope than that of FIG. 11. From FIG. 12, it can be seen that, when the Eu/O co-added GaN layer is formed on the on-axis substrate, the active layer grows spirally, so that more spiral hillocks are formed on the surface, as the Eu/Ga ratio increases, causing rough surface.

Further, FIG. 13 shows the results of measurement at room temperature of the PL spectrum of the Eu-added GaN layer formed on the on-axis substrate. In FIG. 13, (a) shows the relation between PL spectral intensity (a.u.) and the wavelength (nm) (He—Cd laser, when excited at 5 mW), and (b) shows the relation between the excitation force (mW) and the PL integrated intensity (a.u.) at a wavelength of 610 to 650 nm.

From FIG. 13(a), it can be seen that in, the case of the on-axis substrate, the emission peak of $^5D_0 \rightarrow {^7F_2}$, which is the emission center, increases as the Eu/Ga ratio increases. On the other hand, however, as shown in FIG. 13 (b), under strong excitation, even if the Eu/Ga ratio is increased, the saturation phenomenon of light emission is intensified, and when the Eu/Ga ratio is 7.1%, the emission intensity slightly decreases as compared with the case of 3.5%.

Therefore, it has been considered that, in consideration of the surface condition of the Eu-added GaN layer also, the optimum growth condition for growing the Eu-added GaN layer on the on-axis substrate is to be 2.4% in terms of Eu/Ga ratio, and there was a problem in raising the Eu/Ga ratio higher than that.

(2) Eu-Added GaN Layer Formed on the Off-Angle Inclined Substrate

Next, as the present embodiment, the surface state and the emission intensity will be described when the Eu-added GaN layer is formed on the off-angle inclined substrate.

As described above, the present inventors have focused that a strong step flow growth mechanism can be obtained when the crystal growth is performed along the direction in which the crystal axis is slightly inclined by several degrees from the [0001] direction in the thin film growth of the nitride semiconductor, and have formed an Eu-added GaN layer on the off-angle inclined substrate.

Specifically, on a slightly inclined (0001) sapphire substrate having an off-angle of 2° in the maxis direction, two types of red-light emitting devices having the Eu/Ga ratio of 3.5% and 7.1% were prepared in the same manner as that for the case on the on-axis substrate described above.

The lower part of FIG. 12 shows the surface state of the obtained Eu/O co-added GaN layer. From FIG. 12, it can be seen that, in the case of the off-angle inclined substrate, since the active layer is grown not by spiral growth but by step flow growth, the formation of spiral hillock is suppressed and, even if the Eu/Ga ratio is high, the active layer is growing with maintaining high crystallinity.

Further, FIG. 13 also shows the PL spectrum measurement results of the Eu-added GaN layer formed on the off-angle inclined substrate at a Eu/Ga ratio of 3.5%. From FIG. 13(a), it can be seen that, in the case of the off-angle inclined substrate, even if the Eu/Ga ratio is 3.5%, a strong emission intensity that cannot be obtained with the on-axis substrate is obtained. Further, it can be seen from FIG. 13(b), that the saturation phenomenon of light emission is suppressed, and the light emission intensity is improved by 2.04 times as compared with the conventional on-axis substrate (Eu/a ratio 2.4%).

Such an improvement in emission intensity is due to an increase in the uptake of Eu into the active layer and an increase in the Eu concentration in the Eu-added GaN layer even at the same Eu/Ga ratio, and an Eu-added GaN layer with a high Eu concentration can be formed by forming the Eu-added GaN layer on the off-angle inclined substrate. Therefore, it was confirmed that this method is promising as a method for improving the emission intensity.

(3) Usefulness of the Red-Light Emitting Device According to the Present Embodiment As described above, in the red-light emitting device according to the present embodiment, an Eu-added GaN layer having a high Eu concentration can be formed on the off-angle inclined substrate, and can directly contribute to the development of strong emission intensity. Therefore, it is possible to manufacture a highly efficient red-light emitting device, and to realize a high brightness light emitting diode by applying it to semiconductor LEDs in the visible light region, which is being developed mainly for GaN-based materials. Further, in the development of a laser diode using a rare earth-added semiconductor layer including a red-light emitting layer, which has been attracting attention in recent years, as an active layer, high material gain can be achieved by adding a high concentration of a rare earth element such as Eu.

Although the present invention has been described above based on the embodiments, the present invention is not limited to the above embodiments. It is possible to make various modifications to the above embodiments within the same and equivalent scope as the present invention.

DESCRIPTION OF THE REFERENCE NUMERALS

10 Sapphire substrate
20 LT-GaN layer
30 ud-GaN layer
40 Eu-added GaN layer
50 Cap layer
c Distance between c-planes
θ Off-angle

The invention claimed is:

1. A nitride semiconductor device configured by providing a nitride semiconductor layer on a substrate, characterized in that
the substrate is an off-angle inclined substrate,
a rare earth element-added nitride layer to which a rare earth element is added is provided on the substrate as a base treatment layer to prevent the occurrence of a macro step and to flatten a surface, and
a nitride semiconductor layer is provided on the rare earth element-added nitride layer.

2. The nitride semiconductor device according to claim 1, characterized in that
the rare earth element-added nitride layer is a layer in which the rare earth element is added to GaN, InN, AlN, or a mixed crystal of any two or more of these.

3. The nitride semiconductor device according to claim 1, characterized in that
the addition concentration of the rare earth element in the rare earth element-added nitride layer is 0.001 to 10 at %.

4. The nitride semiconductor device according to claim 1, characterized in that the thickness of the rare earth element-added nitride layer of 0.1 nm or more.

5. The nitride semiconductor device according to claim 1, characterized in that the rare earth element is Eu.

6. The nitride semiconductor device according to claim 1, characterized in that the substrate is made of sapphire, SiC or Si; or GaN, InN, AlN or a mixed crystal of any two or more of GaN, InN and AlN.

7. The nitride semiconductor device according to claim 1, which is any one of a light emitting device, a high frequency device and a high-power device.

8. The nitride semiconductor device according to claim 1, characterized in that the off-angle inclined substrate has an off-angle greater than 0.25° and smaller than 2.0°.

9. A substrate used for manufacturing a nitride semiconductor device, in which a rare earth element-added nitride layer to which a rare earth element is added is provided on an off-angle inclined substrate as a base treatment layer to prevent the occurrence of a macro step and to flatten a surface.

10. The substrate according to claim 9, characterized in that the rare earth element-added nitride layer is a layer in which the rare earth element is added to GaN, InN, AlN, or a mixed crystal of any two or more of these.

11. The substrate according to claim 9, characterized in that the addition concentration of the rare earth element in the rare earth element-added nitride layer is 0.001 to 10 at %.

12. The substrate according to claim 9, characterized in that the thickness of the rare earth element-added nitride layer is 0.1 nm or more.

13. The substrate according to claim 9, characterized in that the rare earth element is Eu.

14. The substrate according to claim 9, characterized in that the off-angle inclined substrate is a nitride semiconductor made of sapphire, SiC or Si; or GaN, InN, AlN or a mixed crystal of any two or more of GaN, InN and AlN.

15. A red-light emitting device, characterized in that a rare earth element-added nitride layer in which Eu or Pr is added, as a rare earth element, to GaN, InN, AlN or a mixed crystal of any two or more of these is formed as an active layer, and the active layer is formed on the substrate according to claim 9.

16. A red-light emitting device according to claim 15, characterized in that the rare earth element-added nitride layer is a rare earth element-added nitride layer to which oxygen is co-added.

17. A method for forming a rare earth element-added nitride layer, where a rare earth element added nitride layer is formed on an off-angle inclined substrate; which has
a step of forming a rare earth element-free nitride layer on the off-angle inclined substrate, and
a step of forming a rare earth element-added nitride layer on the rare earth element-free nitride layer as a base treatment layer to prevent the occurrence of a macro step and to flatten a surface; characterized in that
each of the above steps is performed by a series of forming steps using an organic metal vapor phase epitaxial method without taking out from the reaction vessel, and
the formation of the rare earth element-added nitride layer is performed at a temperature of 900 to 1100° C.

18. A method for manufacturing a nitride semiconductor device in which a nitride semiconductor layer is formed on the rare earth element-added nitride layer formed by using the method for forming a rare earth element-added nitride layer according to claim 17.

19. A substrate characterized in that a rare earth element-free nitride layer and a rare earth element-added nitride layer as a base treatment layer to prevent the occurrence of a macro step and to flatten a surface are stacked in this order on an off-angle inclined substrate.

20. A nitride semiconductor device which is formed by stacking a rare earth element-free nitride layer, a rare earth element-added nitride layer as a base treatment layer to prevent the occurrence of a macro step and to flatten a surface, and a nitride semiconductor layer in this order on an off-angle inclined substrate.

21. A red-light emitting device, characterized in that a rare earth element-added nitride layer, in which Eu is added as a rare earth element to GaN, InN, AlN or a mixed crystal of any two or more of these, is formed as a base treatment layer to prevent the occurrence of a macro step and to flatten a surface on an off-angle inclined substrate.

22. A method for manufacturing the red-light emitting device according to claim 21, wherein the rare earth element-added nitride layer in which Eu is added is formed on an off-angle inclined substrate by using an organometallic vapor phase epitaxial method.

* * * * *